United States Patent
Kasichainula et al.

(10) Patent No.: US 8,432,731 B2
(45) Date of Patent: Apr. 30, 2013

(54) MAGNETICALLY COUPLED ELECTROSTATICALLY SHIFTABLE MEMORY DEVICE AND METHOD

(75) Inventors: Sridhar Kasichainula, San Jose, CA (US); Kishore Kasichainula, Phoenix, AZ (US); Mike Daneman, Fremont, CA (US)

(73) Assignees: Sridhar Kasichainula, San Jose, CA (US); Kishor Kasichainula, San Jose, CA (US)

( * ) Notice: Subject to any disclaimer, the term of this patent is extended or adjusted under 35 U.S.C. 154(b) by 1202 days.

(21) Appl. No.: 12/240,563

(22) Filed: Sep. 29, 2008

(65) Prior Publication Data

US 2012/0051128 A1    Mar. 1, 2012

(51) Int. Cl.
*G11C 11/14*    (2006.01)

(52) U.S. Cl.
USPC .......... 365/171; 365/66; 365/173; 365/225.5; 365/230.06; 257/415

(58) Field of Classification Search .................. 365/171, 365/66, 173, 225.5, 230.06; 257/415
See application file for complete search history.

(56) References Cited

U.S. PATENT DOCUMENTS

| | | | | |
|---|---|---|---|---|
| 6,310,526 | B1* | 10/2001 | Yip et al. | 333/262 |
| 6,473,361 | B1* | 10/2002 | Chen et al. | 365/244 |
| 6,611,033 | B2* | 8/2003 | Hsu et al. | 257/414 |
| 6,625,047 | B2* | 9/2003 | Coleman, Jr. | 365/51 |
| 7,349,236 | B2* | 3/2008 | Lin et al. | 365/129 |
| 7,655,324 | B2* | 2/2010 | Kasichainula | 428/693.1 |
| 7,701,754 | B1* | 4/2010 | Parsa et al. | 365/151 |
| 7,928,522 | B2* | 4/2011 | Zhu et al. | 257/415 |
| 8,203,880 | B2* | 6/2012 | Schepens et al. | 365/185.08 |
| 2002/0153584 | A1* | 10/2002 | Frazier et al. | 257/448 |
| 2007/0064349 | A1* | 3/2007 | Kasichainula | 360/324.1 |
| 2008/0277718 | A1* | 11/2008 | Ionescu et al. | 257/324 |
| 2010/0155692 | A1* | 6/2010 | Tran | 257/9 |
| 2011/0312118 | A1* | 12/2011 | Izumi et al. | 438/52 |

* cited by examiner

*Primary Examiner* — Kretelia Graham
(74) *Attorney, Agent, or Firm* — Raj Abhyanker, P.C.

(57) ABSTRACT

A method, system, and apparatus magnetically coupled electrostatically shiftable memory device and method are disclosed. In one embodiment, a method includes electrostatically decoupling a separate structure and a surface that are magnetically coupled (e.g., an electrostatic force to decouple the separate structure and the surface is generated with an electrode), shifting the separate structure between the surface and a other surface with the electrostatic force (e.g., shifting the separate structure moves the entire separate structure), and magnetically coupling the separate structure to the other surface.

8 Claims, 15 Drawing Sheets

VOLTAGE ON TO CLEAR

VOLTAGE OFF TO MAINTAIN

| TRUTH TABLE | | | |
|---|---|---|---|
| ELECTRODE 110 | OTHER ELECTRODE 112 | INPUT TERMINAL 106 | OUTPUT TERMINAL 108 |
| 0 | 0 | 0 | NO CHANGE |
| 0 | 0 | 1 | UN-DETERMINISTIC |
| 0 | 1 | 0 | Z OPEN |
| 0 | 1 | 1 | 1 CLOSE |
| 1 | 0 | 0 | 0 CLOSE |
| 1 | 0 | 1 | Z OPEN |
| 1 | 1 | 0 | UN-DETERMINISTIC |
| 1 | 1 | 1 | NO CHANGE |
| X | X | Z | NO CHANGE |

| TRUTH TABLE | | |
|---|---|---|
| ELECTRODE 110 | INPUT TERMINAL 106 | OUTPUT TERMINAL 108 |
| 0 | 0 | Z OPEN |
| 0 | 1 | 1 CLOSE |
| 1 | 0 | 0 CLOSE |
| 1 | 1 | Z OPEN |
| X | Z | NO CHANGE |

MAGNETIC LAYER 1 DEPOSITION AND PATTERN (SPUTTER DEPOSITION)

INSULATING LAYER 1 DEPOSITION

LANDING ELECTRODE DEPOSITION AND PATTERN – MASK 1

SACRIFICIAL LAYER 1 DEPOSITION AND PATTERN – MASK 2 (SACRIFICIAL LAYER MAY BE DEPOSITED AND PATTERNED IN TWO STEPS OR SELECTIVELY ETCHED TO CREATE THE RECESSED REGIONS)

STRUCTURAL LAYER DEPOSITION AND PATTERN – MASK 3 (SPUTTER DEPOSITION)

SACRIFICIAL LAYER 2 DEPOSITION

MAGNETIC LAYER 2 DEPOSITION AND PATTERN (SPUTTER DEPOSITION) – MASK 4

INSULATION LAYER 2 DEPOSITION + 4-LEVEL VIA ETCH AND FILL – MASKS 5,6,7,8

MAGNETIC LAYER 2 DEPOSITION AND PATTERN (SPUTTER DEPOSITION) – MASK 9

RELEASE (SACRIFICIAL LAYER ETCH IN $O_2$ PLASMA)

MAGNETICALLY COUPLED ELECTROSTATICALLY SHIFTABLE MEMORY DEVICE AND METHOD

FIELD OF TECHNOLOGY

This disclosure generally relates to an enterprise method, a technical field of software and/or hardware technology and, in one example embodiment, to a magnetically coupled electrostatically shiftable memory device and method.

BACKGROUND

Micro-ElectroMechanical Systems (MEMS) are known and in use for sensors, accelerometers, and gas chromatographs. A MEMS device may be used as a switch to interrupt or allow propagation of a signal, and/or to hold an on and/or an off position. A MEMS switch may require application of external energy (e.g., a voltage source) to be bi-stable. Mostly these switches fall in to either ohmic and/or capacitive in nature categories. Alternatively, a minima MEMS switch may use local minima of mechanical energy in a structure to hold a bi-stable position. But all these devices may require a large structure size. In addition, these MEMS devices may consume a large amount of energy and/or have switching times greater than an acceptable threshold time. These switches may therefore not compete with current devices used to store computer memory.

A probe MEMS device may address data by positioning a storage media with respect to an array of sharp probe tips. In order to scan data stored on a media plate, however, this MEMS device may require a large array of probe tip read/write heads, which may add a substantial cost and/or complexity to the memory device. This cost and complexity may prevent the probe MEMS device from competing with commercially available memory devices.

Alternatively, bi-stability can be achieved through surface adhesion and/or modification. A MEMS device may be comprised of a floating beam that may be switched between an open and closed state. The memory device may require an adhesion (e.g., a stiction, a surface tension, etc.) to hold a memory element in a stable position. The adhesion may be unpredictable and/or have varying strengths. The adhesion may be lower than a threshold strength needed to hold the memory element after one use and/or after repeated use, and/or the adhesion may allow the physical structure to disconnect from a surface once a switching force is released. Alternatively, the adhesion may be greater than a threshold strength that will permit the memory element to move after it has been bonded to the surface, preventing the memory device from being used more than once. The unpredictability of such device may limit its practical utility in commercial usage.

SUMMARY

A method, system, and apparatus of a magnetically coupled electrostatically shiftable memory device are disclosed. In one aspect, the memory device may use a magnetic force to maintain stable states of a separate structure. An external energy may be required only to trigger a transition between two stable states of the separate structure based MEMS memory device. As a result, the separate structure based memory device may use true zero power to maintain a stable state. The separate structure based memory device may be non-volatile. The separate structure based memory device may also retain data once all power is removed from the memory device. The separate structure memory device may further have a more compact size than other memory devices. In another aspect, the memory device may be stacked with other memory devices to increase a memory density. The memory devices may be connected to form a memory array structure.

In one aspect, the memory device may be assembled with lower cost raw materials (e.g., lower grade silicon) or alternative materials (e.g., mylar, a flexible substrate) or assembled in a beneficial manner (e.g., a memory device stacked on another memory device). The assembly may require fewer steps than manufacture of traditional semiconductor device that may provide alternative benefits such as reduced number of mask steps, reduced power consumption, higher density and/or lower cost In another aspect, the device may consume less power than other memory devices because it is non-volatile and requires zero stand by current. The memory device may be static, with no refresh overhead. The memory device may have a high switching speed, with less than 10 nanosecond response time. The memory device may have no charge loss failure mechanisms, and it may not be susceptible to a Soft Error Rate (SER).

In another aspect, the memory device may be used in variety of applications, such as: a smart card, a cell phone, a RFID tag, general office equipment, circuitry for power management, portable electronics, and automobile electronics.

In one aspect, a method includes electrostatically decoupling a separate structure and a surface that are magnetically coupled (e.g., an electrostatic force to decouple the separate structure and the surface is generated with an electrode), shifting the separate structure between the surface and a other surface with the electrostatic force (e.g., shifting the separate structure moves the entire separate structure), and magnetically coupling the separate structure to the other surface.

The separate structure may be magnetically coupled when a magnetic attraction holds the separate structure in proximity to the surface and/or the other surface. In one aspect, the surface has a permanent magnetic moment. In another aspect, the separate structure has a permanent magnetic moment. The separate structure may be mechanically distinct from the surface and the other surface, and it may be detachable from both the separate structure and the other surface. Decoupling the separate structure from the surface may remove all connections between the separate structure and the surface.

In another aspect, the separate structure may be constrained to move substantially perpendicularly to the plane of the surface and the other surface. In yet another aspect, the separate structure may also be moveable with other degrees of freedom. In yet another aspect, the separate structure may be made of a magnetic material, a ferromagnetic material, and a permanent magnet.

In another aspect, the separate structure may have any shape. The separate structure may be comprised of one and/or a combination of multiple forms such as a bar, a disk, a cylinder, a pole, a cube, an asymmetrical form and/or a planar surface. The separate structure may have holes, openings, cutouts, additional surfaces, guide rails, connecting parts for the surface, the other surface, and other surrounding surfaces. The separate structure may have indentations, protrusions, and flat surfaces.

The electrode may generate an electrostatic force when an electric potential is applied to the electrode. The surface, the other surface, and the separate structure may each include a magnetic material, a ferromagnetic material, a nonmagnetic material, a diamagnetic material, and/or a paramagnetic material. The method may include substantially matching the electric potential between a contact surface, the surface, the other surface, and the separate structure. Matching the electric potential may prevent stiction and/or arc-welding. The method may include applying a refresh voltage to the contact surface, the surface, the other surface, and/or the separate structure to remove a residual charge. The method may also include generating an additional electrostatic force when an additional electric potential is applied to an additional electrode.

The method may also include decoupling an input terminal and an output terminal when the separate structure is decoupled from the surface with the electrostatic force. The input terminal and the output terminal may be electrically coupled when the separate structure is magnetically coupled to the surface. The electrostatic force may be generated with the electrode and/or the additional electrode. The method may also include inverting the electric potential to be applied to the additional electrode.

The method may include using the memory device as a four terminal device. In one aspect, when a voltage is applied between the input terminal and the electrode, the separate structure closes the connection between the input terminal and the output terminal. In this position, the input terminal and the output terminal are coupled together, and the switch is in a closed position. In another aspect, the separate structure is magnetically coupled to a surface, keeping the input and output terminals electrically coupled even after the voltage applied between the electrode and the input terminal is removed. This may be an upper logic state, which may be a logic value 1.

In another aspect, a voltage may be applied between the additional electrode and the input terminal to decouple the separate structure from the surface and to open the switch. The electrostatic force generated by the additional electrode may pull the separate structure away from the surface and towards the other surface. The separate structure may then be magnetically coupled to the other surface. This may be an open state of the memory device, or a lower logic state (e.g., a logic value 0). In one aspect, the switch may remain in this position after the electrostatic force is removed because the separate structure is magnetically coupled to the other surface.

In yet another aspect, a potential may be applied to the electrode to repel the separate structure to decouple it from the surface. In another aspect, both the electrode and the additional electrode may be used to decouple the separate structure. Multiple electrodes may be used, whether associated with only the surface, only the other surface, or both the surface and the other surface. In another embodiment, electrodes may be used in additional surfaces to constrain the separate surface and to guide it towards or away from surface and the other surface.

In another embodiment, the device is used as a three-terminal device, wherein the electrode and the additional electrode are connected by an inverter, and the potential applied to the additional electrode is the opposite polarity of the potential applied to the electrode.

The method may include storing an information in a memory cell by magnetically coupling the separate structure to the surface and/or the other surface. The memory unit (e.g., may be plurality of elements arranged in an array) may include the surface, the other surface, the separate structure, the input terminal, the output terminal, the electrode, and/or the additional electrode. The input terminal may be coupled to an address line, the output terminal may be coupled to a read line, and the electrode may be coupled to a column line.

The method may also include writing an upper logic value to the memory unit by reducing the electric potential applied to the column line of the memory unit to a lower logic value and increasing the electric potential applied to the address line of the memory unit to an upper logic value. The upper logic value may be generated when the separate structure is magnetically coupled to the surface.

In addition, the method may include writing a lower logic value to the memory unit by increasing the electric potential applied to the column line of the memory array to an upper logic value (e.g., 1) and increasing the electric potential applied to the address line of the memory array to the upper logic value. The lower logic value may be generated when the separate structure is decoupled from the surface by an electrostatic force and coupled to the other surface.

The method may include reading an upper logic value (e.g., an open position) and/or a lower logic value (e.g., a closed position) of the memory unit by increasing the electric potential applied to the address line of the memory unit to an upper logic value and setting the column line of the memory unit to an open condition by opening a column switch. A column switch output may be coupled to the column line. A column input and/or a column output may be decoupled when the column switch is opened. The method may also include aligning the separate structure in a preferred orientation with a contact element of the separate structure. The contact element may be a raised surface, a lowered surface, a protrusion, an indentation, and/or a designated contact portion of the separate structure. The contact element may take a variety of forms and surfaces, including openings, cutouts, protrusions, clasps, pins, and other objects.

In another aspect, a system includes a separate structure (e.g., may be magnetically coupleable), a surface to be magnetically coupled to the separate structure (e.g., an input terminal and an output terminal are electrically coupled when the separate structure and the surface are magnetically coupled). The system also includes an other surface to be magnetically coupled with the separate structure when the separate structure and the surface are decoupled by an electrostatic force (e.g., the electrostatic force is generated by an electrode and/or an additional electrode, and a gap separates the surface and the other surface).

The memory system may include an address line coupled to the input terminal to allow a row of a memory array (e.g., may include memory system) to be selected when a read and a write operation is performed. The memory system may include a column line coupled to the electrode to allow a column of the memory array to be selected when a read and/or a write operation is performed. The memory system may include a read line coupled to the output terminal to allow an open and/or an upper logic value of the memory unit to be read. The memory system may include a column switch coupled to the column line to control an electric potential applied to the electrode. The system may include an address switch coupled to the column line to control the electric potential applied to the input terminal.

In the memory system, the surface, the other surface, and the separate structure may each include the magnetic material and/or a ferromagnetic material. The memory system may include an electric potential that is substantially matched between a contact surface and the separate structure. The memory system may further include an additional electrode that may be used to generate the electrostatic force.

The memory system may include a memory array that includes an address line, a column line, a column line, a read line, and a memory element. The memory element may be a system that includes the separate structure, the surface, the other surface, the shifting module, the securing module, the electrode, an input terminal, and an output terminal. The input terminal may be coupled to the address line, the output terminal may be coupled to the read line, and the electrode may be coupled to the column line.

The surface, the other surface and/or the separate structure may include a magnetic material and/or a ferromagnetic material. The electric potential between a contact surface and the separate structure may be substantially matched. The memory system may include an additional electrode. The additional electrode may be used to generate the electrostatic force. The memory system may include a memory array comprised of an address line, a column line, a read line, and/or a memory element. The memory element may be a system comprised of the separate structure, the surface, the other surface, the shifting module, the securing module, the electrode, an input terminal and/or an output terminal. The input terminal may be coupled to the address line, the output terminal is coupled to the read line, and/or the electrode may be coupled to the column line.

In yet another aspect, a method of manufacturing the device includes creating a substrate layer (e.g., the substrate layer may include a polymer, a glass, a ceramic, a metallurgical grade silicon, an impure silicon, a standard silicon, etc.), forming a magnetic layer above the substrate layer, creating an electrode above the magnetic layer, placing a separate structure above the electrode, forming an additional electrode above the separate structure, and placing an other magnetic layer above the additional electrode.

In another aspect, the electrode may be above the magnetic elements. In yet another aspect, the electrode may be below the magnetic elements. In another aspect, the electrode may be coplanar with the magnetic elements.

In another aspect, the surface may be above the magnetic element and the electrode. In another aspect, the surface may be below the magnetic element and the electrode. In another aspect, the surface may be coplanar with the magnetic element and the electrode. The surface and the other surface may be separated by a vacuum, an air gap, a fluid (oil, water, a nonconducting fluid), a polymer.

In one aspect, the electrode may be both soft magnetic and electrically conductive. In another aspect, the electrode may be made of one of multiple materials (e.g., NiFe, Ni, Ni—Si, etc.). In another aspect, the surface and the other surface may be comprised of one of multiple materials (e.g., AlNiCo, NdFeB, Sm—Co, etc.). The electrode, the surface, the other surface, and the separate structure may be coated with at least one of an insulator (e.g., a nonconductive surface, an oxide, a polymer etc.).

The manufacturing steps for the device may be fewer in number than for a traditional transistor based manufacturing system. In another aspect, the device may require approximately ⅓ of the steps needed to manufacture a transistor based memory device. The material used for manufacturing the substrate material may be a low cost material, such as: a polymer, glass, scrap, an impure silicon, a crystalline material, a polymer, a ceramic material. The substrate may also be made of a regular, high transistor grade silicon.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF FIGURES

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, system, and apparatus of a magnetically coupled electrostatically shiftable memory device are disclosed. Although the present embodiments have been described with reference to specific example embodiments, it will be evident that various modifications and changes may be made to these embodiments without departing from the broader spirit and scope of the various embodiments.

In one embodiment, a method includes electrostatically decoupling a separate structure (e.g., the separate structure 100 of FIG. 1) and a surface (e.g., the surface 102 of FIG. 1) that are magnetically coupled (e.g., an electrostatic force to decouple the separate structure and the surface is generated with an electrode), shifting the separate structure 100 between the surface 102 and an other surface (e.g., the other surface 104 of FIG. 1) with the electrostatic force (e.g., shifting the separate structure moves the entire separate structure 100), and magnetically coupling the separate structure 100 to the other surface 104.

Figure 1:
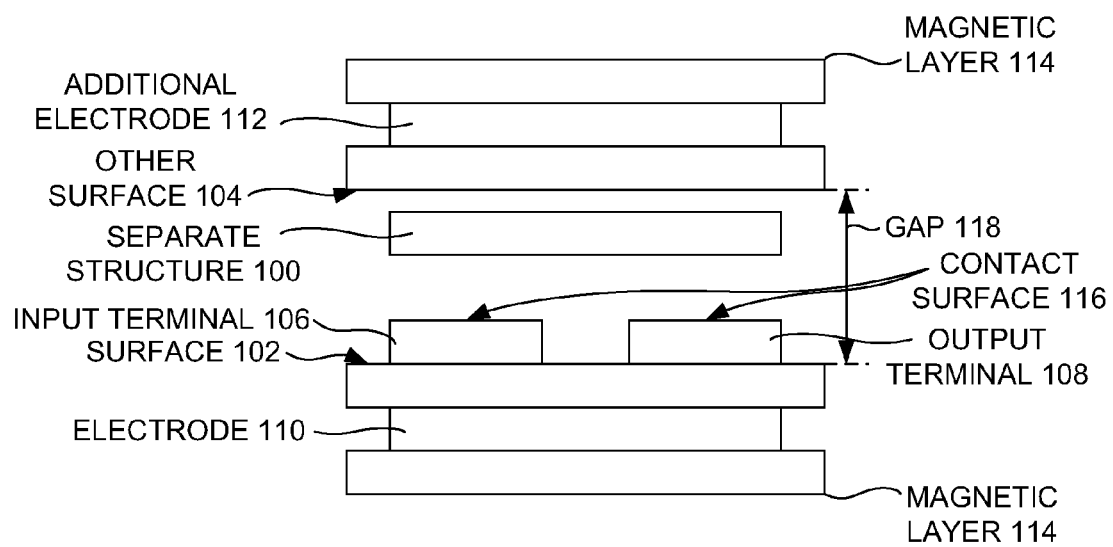
FIG. 1 is a cross sectional view of a memory unit, according to one embodiment.

In another embodiment, a system includes a separate structure (e.g., the separate structure 100 of FIG. 1, a magnetically coupleable structure, etc.), a surface (e.g., the surface 102 of FIG. 1) to be magnetically coupled to the separate structure 100, an input terminal (e.g., the input terminal 106 of FIG. 1), an output terminal (e.g., the output terminal 108 of FIG. 1). In an example embodiment, the input terminal and the output terminal are electrically coupled when the separate structure 100 and the surface 102 are magnetically coupled). The system also includes an other surface (e.g., the other surface 104 of FIG. 1) to be magnetically coupled with the separate structure 100 when the separate structure 100 and the surface 102 are decoupled by an electrostatic force (e.g., generated by an electrode 110, generated by an additional electrode 112). In an example embodiment, a gap separates the surface 102 and the other surface 104.

In yet another embodiment, a method includes creating a substrate layer (e.g., of the substrate 812A-B of FIG. 8) (e.g. the substrate layer may include a polymer, a glass, a metallurgical grade silicon, an impure silicon, and a standard silicon), forming a magnetic layer (e.g., the magnetic layer 114 of FIG. 1) above the substrate layer, creating an electrode (e.g., the electrode 110 of FIG. 1) above the magnetic layer 114, placing a separate structure (e.g., the separate structure 100 of FIG. 1) above the electrode 110, forming an additional electrode (e.g., the additional electrode 112 of FIG. 1) above the separate structure 100, and placing an other magnetic layer above the additional electrode 112.

FIG. 1 is a cross sectional view of a memory unit, according to one embodiment. Particularly, FIG. 1 illustrates a separate structure 100, a surface 102, an other surface 104, an input terminal 106, an output terminal 108, an electrode 110, an additional electrode 112, a magnetic layer 114, a contact surface 116, and a gap 118, according to one embodiment. In addition, the shifting module may include the electrode 110, the additional electrode 112, and/or the separate structure 100. The securing module may include the surface 102 and/or the other surface 104.

The separate structure 100 (e.g., a bar, a disk, a cylinder, a pole, a cube, an asymmetrical form, a planar surface, etc) may be a diamagnetic material, a paramagnetic material, a magnetic material, a ferromagnetic material, a permanent magnet, etc. that may have holes, openings, cutouts, additional surfaces, guide rails, connecting parts for the surface, the other surface, and the other surrounding surfaces that may be required for storing the data (e.g., information, etc.) in the memory unit. The surface 102 may be an alloy that may include the input terminal 106 and/or the output terminal 108. The other surface 104 may be an alloy that may be coupled to the separate structure 100. The input terminal 106 may be a terminal (e.g., a terminal coupled to the surface 102) used to input (e.g., write) the information (e.g., electronic data) to be stored on the memory unit. The output terminal 108 (e.g., a terminal coupled to the surface 102) may be used to read the information from the memory unit. The electrode 110 may be made of a material (e.g., Ni, Ni—Si, alloy etc.) that comprise a soft magnet. The electrode 110 may further comprise an electrically conductive material connected with a nonmetallic part of a circuit (e.g. a semiconductor, an electrolyte, a vacuum etc.). The additional electrode 112 (e.g., Ni, Ni—Si, alloy etc.) may be an electrical conductor connected with a nonmetallic part of a circuit (e.g. a semiconductor, an electrolyte, a vacuum etc.). The magnetic layer 114 may be a layer of magnetic material on the surface of the electrode 110 and/or the additional electrode 112.

The contact surface 116 may be the surface (e.g., a refresh voltage may be applied) on the input terminal 106 and output terminal 108.

The gap 118 between the surface 102 and the other surface 104 may be an empty space (e.g., a vacuum, a void, an air gap) and/or the gap may be filled with a fluid (e.g., oil, water, a non conducting fluid, etc.).

In an example embodiment, the memory unit may include the surface 102, the other surface 104, the separate structure 100, the input terminal 106, the output terminal 108, the electrode 110, and/or the additional electrode 112. The separate structure 100 may be positioned between the surface 102 and the other surface 104 and/or may be mechanically distinct from each other. Decoupling the separate structure 100 may remove all connections between the separate structure 100 and the surface 102. The gap 118 between the surface 102 and the other surface 104 may be an empty space (e.g., a vacuum, a void, an air gap) and/or the gap may be filled with a fluid (e.g., oil, water, a non conducting fluid, etc.). The contact surface 116 may be the surface on the input terminal 106 and output terminal 108.

In one embodiment, the separate structure 100 and the surface 102 that are magnetically coupled may be electrostatically decoupled (e.g., an electrostatic force to decouple the separate structure 100 and the surface 102 may be generated with an electrode). The separate structure 100 may be shifted between the surface 102 and the other surface with the electrostatic force (e.g., an attraction and/or a repulsion generated by a difference in electrical potentials between two or more surfaces). Shifting the separate structure 100 may move the entire separate structure 100. The separate structure 100 may be magnetically coupled to the other surface 104. The separate structure 100 may be magnetically coupled when a magnetic attraction holds the separate structure 100 in proximity to the surface 102 and/or the other surface 104.

In another embodiment, the shifting of the separate structure may be controlled by the basic force balance formula which follows:

$$M \cdot \ddot{y}(t) + b \cdot \dot{y}(t) + k \cdot y(t) = \frac{\varepsilon_0 w L V^2}{2 \cdot (g - y(t))^2}$$

M may be the mass of the moving element, k may be the spring constant, b may be the damping coefficient, w and L are may be the length and width of the moving element, g may be the gap 118 between the moving element and the electrode, and V may be the applied voltage.

In one embodiment, given the use of a separate structure, the spring constant k becomes zero. Further, when the moving element is sufficiently small, the damping coefficient becomes negligible. Therefore the equation reduces to:

$$M \cdot \ddot{y}(t) = \frac{\varepsilon_0 w L V^2}{2 \cdot (g - y(t))^2}$$

In another embodiment, since the mass M is proportional to the length and width of the moving element, those variables can be cancelled, resulting in an equation that only depends on the thickness and density of the moving element, the electrode gap 118, and the applied voltage:

$$\rho \cdot t \cdot \ddot{y}(t) = \frac{\varepsilon_0 \cdot V^2}{2 \cdot (g - y(t))^2}$$

Where t is the thickness, and ρ is the density of the moving element material. In an embodiment, given a constant density, the switching speed of such a device may be dependent only upon thickness, gap 118, and voltage.

The surface 102, the other surface 104, and the separate structure 100 may include the magnetic material and/or the ferromagnetic material. The electric potential between the contact surface 116 and the separate structure 100 may be substantially matched. The memory system may include the additional electrode 112. The additional electrode 112 may be used to generate the electrostatic force. The memory system may include the memory array including the address line, the column line, the read line, and/or the memory element.

In another embodiment, the electrode 110 may generate an electrostatic force when an electric potential is applied to the electrode 110. The surface 102, the other surface 104, and the separate structure 100 may each include a magnetic material and/or a ferromagnetic material. The electric potential may be substantially matched between a contact surface 116, the surface 102, the other surface 104, and the separate structure 100. Matching the electric potentials may prevent stiction and arc-welding. A refresh voltage may be applied to the contact surface 116, the surface 102, the other surface 104, and/or the separate structure 100 to remove a residual charge. The additional electrostatic force may be generated when an additional electric potential is applied to the additional electrode.

The input terminal 106 and an output terminal 108 may be decoupled when the separate structure 100 is decoupled from the surface 102 with the electrostatic force. The input terminal 106 and the output terminal 108 may be electrically coupled when the separate structure 100 is magnetically coupled to the surface 102. The electrostatic force may be generated with the electrode 110 and the additional electrode 112. The electric potential to be applied to the additional electrode 112 may have opposite polarities (e.g., inverted polarities).

An information in a memory unit may be stored by magnetically coupling the separate structure 100 to the surface 102 and/or the other surface 104. The memory unit may include the surface 102, the other surface 104, the separate structure 100, the input terminal 106, the output terminal 108, the electrode 110, and/or the additional electrode 112.

The memory unit may be stacked on an other memory unit. The separate structure 100 may include a bar, a disk, a cylinder, a pole, a cube, an asymmetrical form, and/or a planar surface. The separate structure 100 may be magnetically coupleable. The surface 102 may be magnetically coupled to the separate structure 100. The input terminal 106 and/or the output terminal 108 may be electrically coupled when the separate structure 100 and the surface 102 are magnetically coupled. The other surface 104 to be magnetically coupled with the separate structure 100 when the separate structure 100 and the surface 102 are decoupled by an electrostatic force (e.g., the electrostatic force may be generated by the electrode 110 and an additional electrode 112, and/or a gap 118 may separate the surface 102 and the other surface 104).

FIG. 2A-D is a systematic view illustrating different configurations to manage the data in the memory unit, according to one embodiment. Particularly, FIG. 2A-D illustrates an input terminal 206, an output terminal 208, and a separate structure 200, according to one embodiment.

The separate structure 200 may be magnetically coupleable to the surface 102. The input terminal 206 may be the terminal which may be coupled to the address line and may be electrically coupleable when the separate structure 200 may be magnetically coupled to the surface 102. The output terminal 208 may be coupled to the read line and may be electrically coupleable when the separate structure 200 may be magnetically coupled to the surface 102.

Figure 2A:
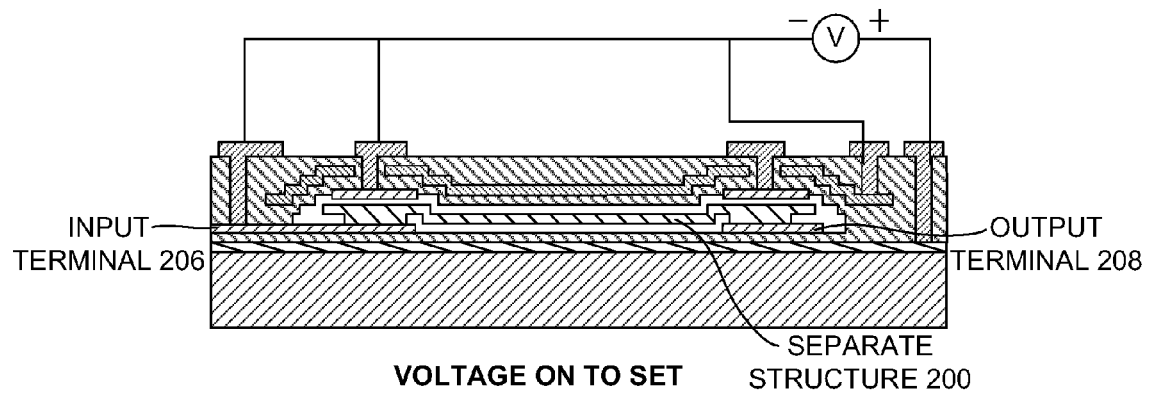
FIG. 2A-D is a systematic view illustrating different steps to shift a separate structure and couple a separate structure, according to one embodiment.
Figure 2B:
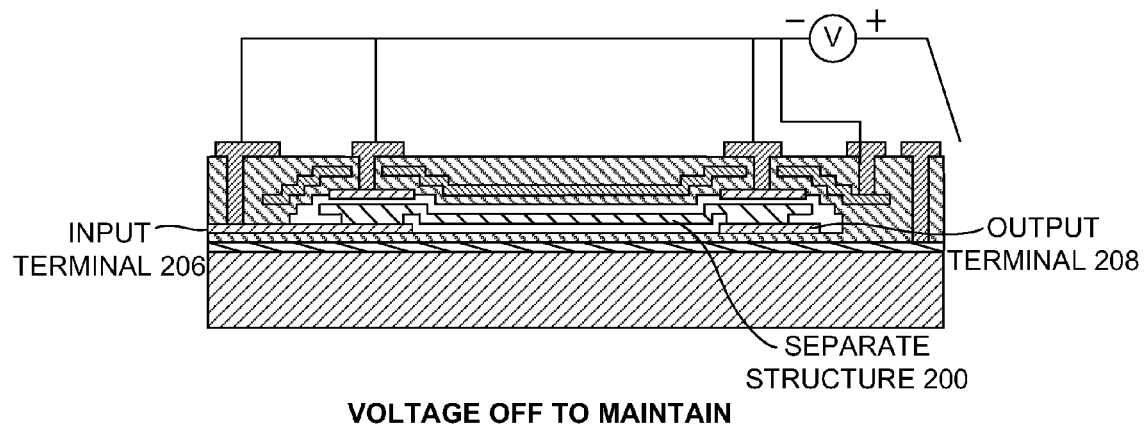
Figure 2C:
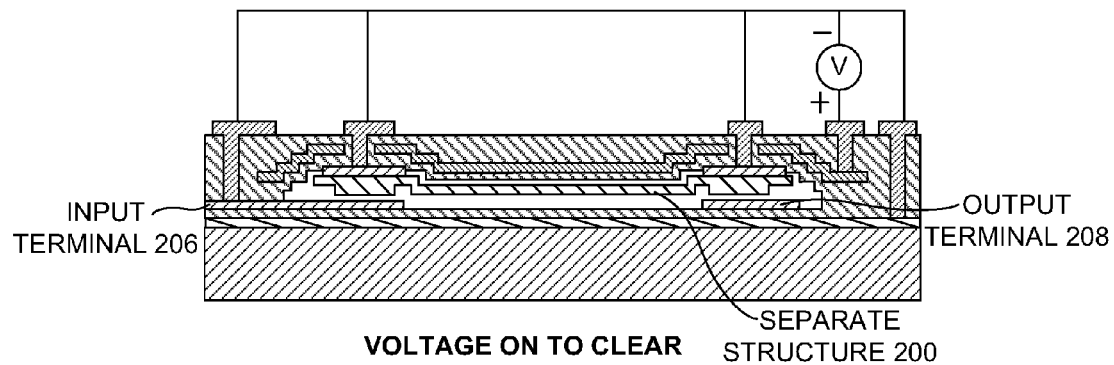
Figure 2D:
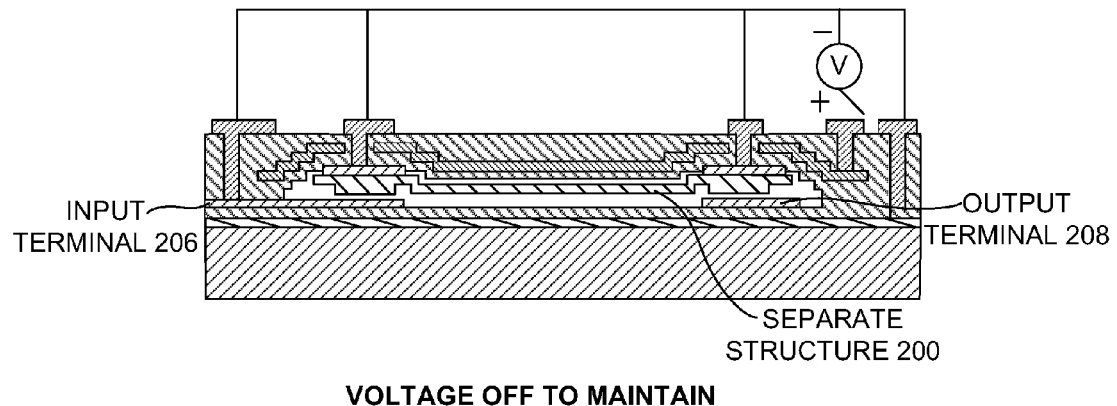

In the example embodiment, FIG. 2A illustrates the configuration (e.g., voltage on) that may enable the memory unit to set. FIG. 2B illustrates configuration (e.g., voltage off) that may enable the memory unit to maintain the state. FIG. 2C illustrates the configuration (e.g., voltage on) that may enable the memory unit to clear its state. FIG. 2D illustrates the configuration (e.g., voltage off) that may enable the memory unit to maintain its clear state.

Figure 3A:
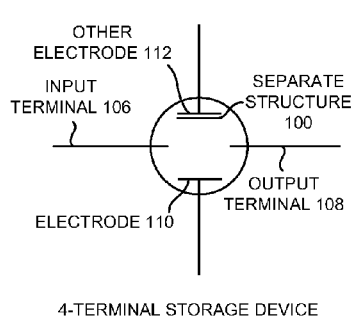
FIG. 3A-B is a diagrammatic view of 4-terminal storage device and 3-terminal storage device with their respective truth tables, according to one embodiment.
Figure 3B:
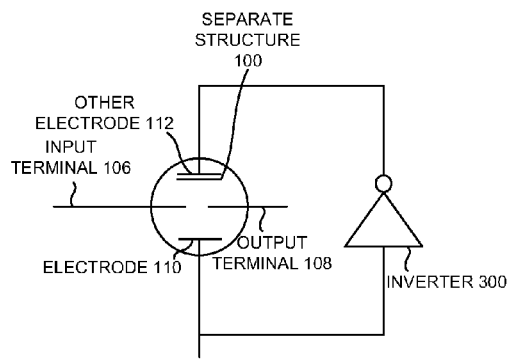

FIG. 3A-B is a diagrammatic view of a 4-terminal storage device and a 3-terminal storage device with their respective truth tables, according to one embodiment. Particularly, FIG. 3A-B illustrates the input terminal 106, the output terminal 108, the electrode 110, the additional electrode 112 and an inverter 300, according to one embodiment.

The inverter 300 may be a logic gate that may invert (e.g., alter to an opposite polarity charge) the digital signal given as an input at the output of the inverter 300.

In an example embodiment, FIG. 3A illustrates a four terminal storage device (e.g., the four terminals may be the input terminal 106, the output terminal 108, the electrode 110, and the additional electrode 112). The output data may depend on data at the input terminal 106, the electrode 110 and the additional electrode 112. In an example embodiment, the truth table described in FIG. 3A illustrates various combinations and the output data that may be obtained for various inputs for a four-terminal storage device.

In an example embodiment, "un-deterministic" indicates that the output may be uncertain for the given inputs. "No change" may indicate that the output does not change for the given inputs. "Z" may refer to a high resistance condition (e.g., an open switch, a disconnected line, etc.) "1" may be an upper logic value. "0" may be a lower logic value. "Close" may refer to a closed switch condition (e.g., the input terminal and the output terminal are electrically coupled, the separate structure is magnetically coupled to the surface, etc.). "No change" may indicate that the output does not change for the given inputs.

In another example embodiment, when the logical inputs (e.g., from the input terminal 106, the electrode 110, and the additional electrode 112 respectively) are "0, 0, 0", the state at the output terminal 108 may not change. When the logical inputs are "0, 0, 1" the state at the output terminal 108 may not change and/or may be undeterministic.

When the logical inputs are "0, 1, 0" the state at the output terminal 108 may have "Z" open state. When the logical inputs are "0, 1, 1" the state at the output terminal 108 may be "1" close. When the logical inputs are "1, 0, 0" the state at the output terminal 108 may be "0" close. When the logical inputs are "1, 0, 1" the state at the output terminal 108 may be "Z" open. When the logical inputs are "1, 1, 0" the state at the output terminal 108 may be undeterministic. When the logical inputs are "1, 1, 1" the state at the output terminal 108 may remain unchanged. In addition, when the logical inputs are "X, X, Z" the state at the output terminal 108 may not change (e.g., "X" may be a don't care condition). The input terminal 106 and the output terminal 108 may be the base terminals. The electrode 110 may be the close terminal and the additional electrode 112 may be the open terminal.

In an example embodiment, FIG. 3B illustrates the three terminal storage device. The three terminals may be the input terminal 106, the output terminal 108 and the electrode 110. The additional terminal may be constructed using the inverter 300. The data coming to the electrode 110 terminal may be inverted (e.g., given an opposite polarity potential) and given to the additional electrode 112.

The truth table illustrated in FIG. 3B describes various combinations and the output data that may be obtained. When the logical inputs (e.g., from the input terminal 106, and the electrode 110 respectively) are "0, 0", the state at the output terminal 108 may be "Z open". When the logical inputs are "0, 1", the state at the output terminal 108 may be "1 close". When the logical inputs are "1, 0", the state at the output terminal 108 may be "0 close". When the logical inputs are "1, 1", the state at the output terminal 108 may be "Z open". In addition, when the logical inputs are "X, Z", the state at the output terminal 108 may not change.

Figure 4:
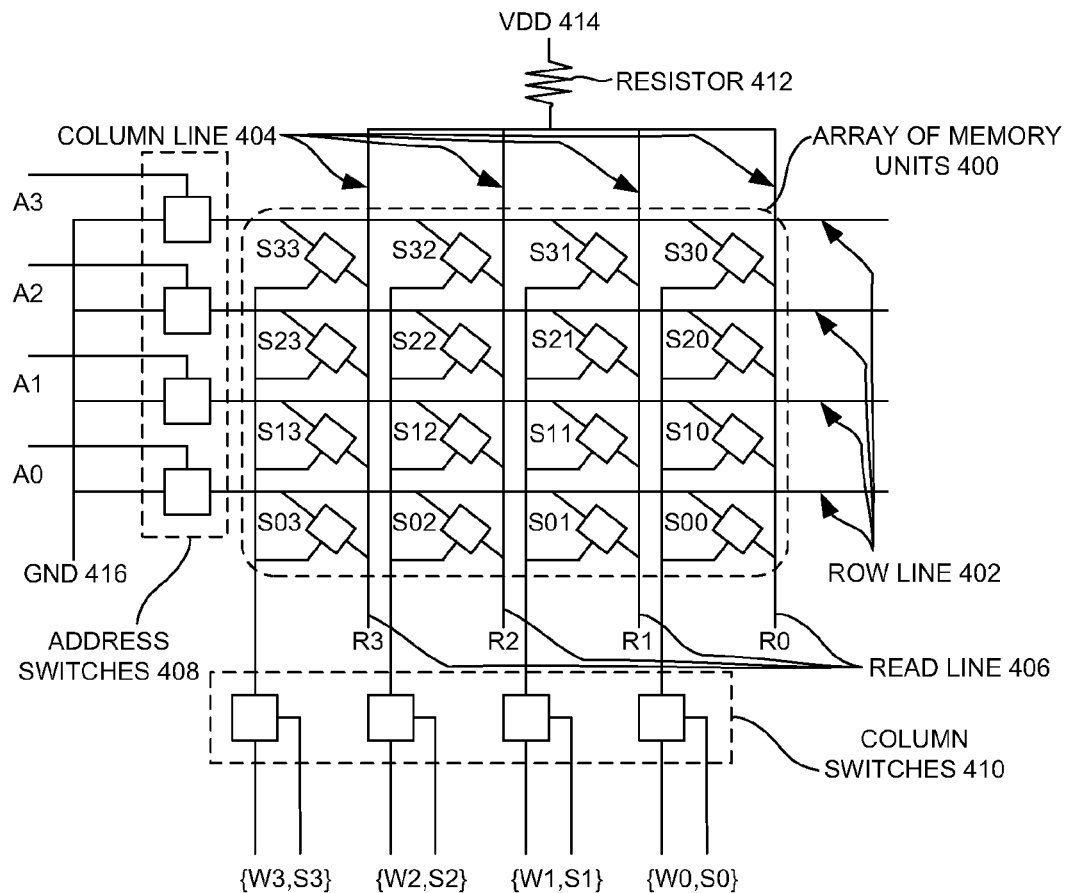
FIG. 4 is a schematic view illustrating internal circuitry for read and/or write operations, according to one embodiment.

FIG. 4 is a schematic view of illustrating internal circuitry for read and/or write operations, according to one embodiment. Particularly, FIG. 4 illustrates array of memory units 400, row line 402, column line 404, read line 406, address switches 408, column switches 410, a resistor 412, VDD 414, and a ground 416, according to one embodiment.

The array of memory units 400 may contain various elements of memory unit that may be used to store information (e.g., electronic data). The row line 402 may be used to select a given memory unit along with the column line 404. Each of the column line 404 may enable a particular switch in an address line to be selected. Each column line 404 may be connected to the input terminals of a memory array. The read line 406 may be connected to the output terminals for a column of memory units of the memory array. The read line 406 may enable data to be fetched when a given memory unit is selected (e.g., made active) using a particular column line 404 and a particular row line 402.

The address switches 408 may be used to select a particular address line. The column switches 410 may be the switches for read and/or write operations. The resistor 412 may be a device used in an electrical circuit to oppose the flow (e.g., limit, safeguard, etc.) of an electric current. The VDD 414 may be the input source for the supply of the voltage to the memory device. The ground 416 may be a conducting body used as a common return for an electric circuit and/or may be used as an arbitrary zero of potential. The ground 416 may be a lower logic level.

In an example embodiment, FIG. 4 illustrates the circuit diagram of the memory device. The address switches 408 may be used to select a particular address line and may have the gnd 416 (e.g., the ground terminal). The address lines and the column line 404 that may have column switches may be used to select a set of switches for read and/or write operations. The VDD 414 may supply voltage to the memory device through resistor 412. The read line 406 may be used to fetch data from the memory device using switches. The array of memory units 400 may be comprised of any number of memory units (e.g., the memory unit 600, the memory unit 700).

In an example embodiment, during a read operation, one of the address lines may be selected (e.g., if {A3,A2,A1, A0}="1000," then address line switch A is closed and the switches A0, A1 and A3 are open). In the example embodiment, if S13 and S11 switches are closed and S12 and S10 switches are open then the read data will be "0101". In an additional example embodiment, during a write operation, one of the address lines may be selected, and the content to be written may be controlled by a column line 404. A column line 404 may be controlled using an additional three-terminal switch, wherein the input terminal and the electrode logic values are represented by the pair, {Wn,Sn}.

The input terminal line may be represented by Wn, and the electrode may be represented by Sn, and "n" may indicate which column value is represented by the pair, {Wn,Sn}. In an example embodiment, to write '1' (e.g., to close the memory unit switch) into the storage cell, the {Wn, Sn} pair is forced to "01." In a further example embodiment, to write '0' (e.g., to open the memory unit switch) into the cell {Wn, Sn} pair is forced to "10" (e.g., opens the switch). Once the voltages on the column line 404 and the row line 402 are removed, the selected memory unit may retain the information written to that unit.

In one embodiment, the memory unit (e.g., the memory unit 600) may be an element of a memory array. The input terminal 106 may be coupled to an address line, the output terminal 108 may be coupled to a read line (e.g. the read line 406 FIG. 4), and/or the electrode 110 may be coupled to a column line 404 (e.g., the column line 404 FIG. 4).

An upper logic value (e.g., a closed position) may be written to the memory unit (e.g., the memory unit 600) by reducing the electric potential applied to the column line 404 of the memory unit to a lower logic value. The upper logic value may be written to the memory unit by increasing the electric potential applied to the address line of the memory unit to an upper logic value. The upper logic value may be generated when the separate structure 100 is magnetically coupled to the surface 102.

A lower logic value (e.g., an open position) may be written to the memory unit (e.g., the memory unit 600) by increasing the electric potential applied to the column line 404 of the memory array to an upper logic value. The lower logic value may be written to the memory unit by increasing the electric potential applied to the address line of the memory array to the upper logic value. The lower logic value may be generated when the separate structure 100 is decoupled from the surface 102 by an electrostatic force and coupled to the other surface 104. A lower logic value and an upper logic value of the memory unit may be read by, increasing the electric potential applied to the address line of the memory unit (e.g., the memory unit 600, the memory unit 700) to an upper logic value.

A lower logic value and an upper logic value of the memory unit may be read by setting the column line 404 of the memory unit to an open condition by opening a column switch. A column switch output may be coupled to the column line 404 (e.g., column input and a column output may be decoupled when the column switch is opened). The separate structure 100 may be aligned in a preferred orientation with a contact element of the separate structure 100 (e.g., the contact element may be a raised surface, a lowered surface, a protrusion, an indentation, and/or a designated contact portion of the separate structure 100).

The memory element may be the system including the separate structure 100, the surface 102, the other surface 104, the shifting module, the securing module, the electrode 110, the input terminal 106 and/or the output terminal 108. The input terminal 106 may be coupled to the address line, the output terminal 108 is coupled to the read line and/or the electrode 110 may be coupled to the column line. The shifting module may include the electrode 110, the additional electrode 112, and/or the separate structure 100. The securing module may include the surface 102 and/or the other surface 104.

Figure 5A:
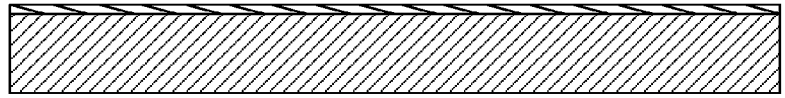
FIG. 5A-J is a systematic view illustrating steps to manufacture the memory unit, according to one embodiment.
Figure 5B:
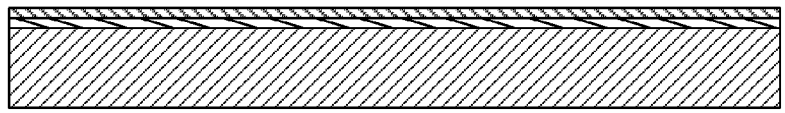
Figure 5C:
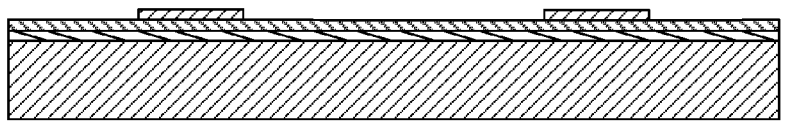
Figure 5D:
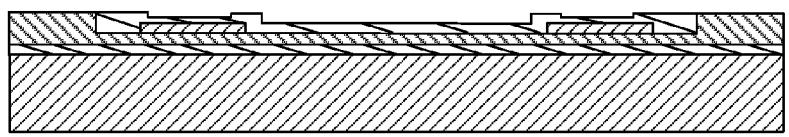

FIG. 5A-J is a systematic view illustrating growth (e.g., construction) of the memory unit, according to one embodiment. Particularly, FIG. 5A-J illustrates fabrication of the device, according to one embodiment. FIG. 5A illustrates magnetic layer deposition (e.g., PECVD oxide: using a process used to deposit thin films from a vapor state to a solid state on some substrate) and patterning on the base material through ejection of atoms from the base material (e.g., a target base) by bombardment by energetic ions (e.g., sputtering). FIG. 5B illustrates insulation of the deposited layer. FIG. 5C illustrates landing electrode deposition and patterning (e.g., using Aluminum). FIG. 5D illustrates a sacrificial layer deposition and patterning (e.g., photoresist and other polymers).

Sacrificial layer may be deposited and patterned in two steps or selectively etched to create the recessed regions.

Figure 5E:
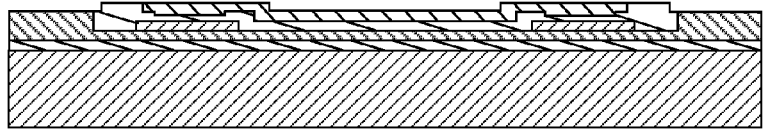
Figure 5F:
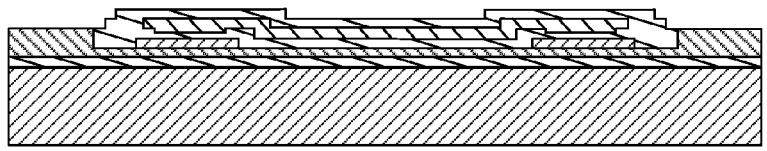
Figure 5G:
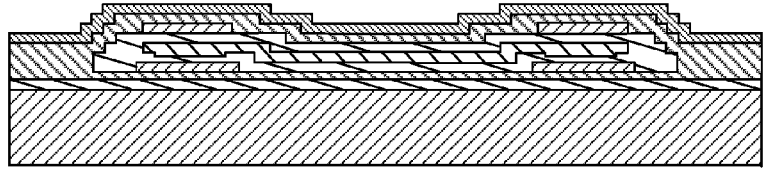
Figure 5H:
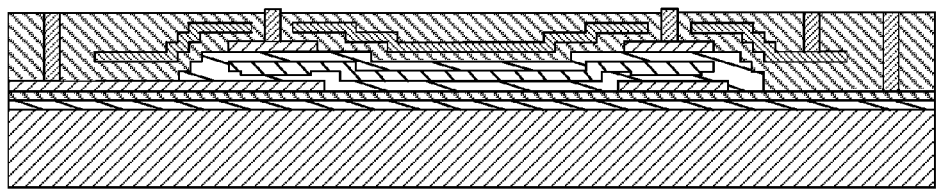
Figure 5I:
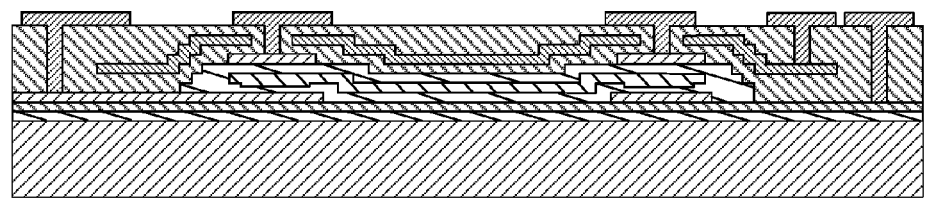
Figure 5J:
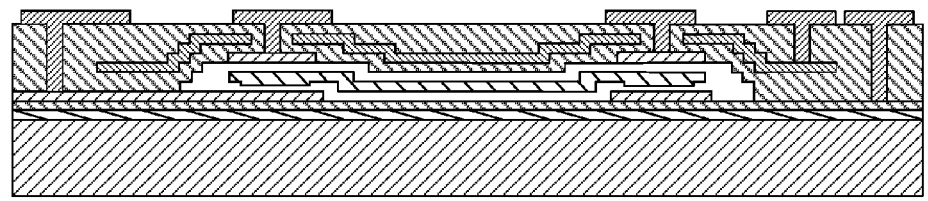

FIG. 5E illustrates sacrificial layer 2 deposition (e.g., using photoresist or other polymer) (e.g., mask 3). FIG. 5F illustrates sacrificial layer deposition and pattern (e.g., using Aluminum). FIG. 5G illustrates magnetic layer 2 deposition and pattern (e.g., using Alnico and other—sputter deposition) (e.g., mask 4). FIG. 5H illustrates insulation layer 2 deposition (e.g., PECVD oxide) and 4-level etch and fill masks 5, 6, 7, 8. FIG. 5I illustrates magnetic layer 2 deposition and pattern (e.g., sputter deposition) (e.g., mask 9). FIG. 5J illustrates release (e.g., sacrificial layer etch in $O_2$ plasma).

In an example embodiment, the micro-mechanical storage device may be fabricated using standard semi-conductor fabrication processes and equipment. In one embodiment, the memory device layer 802A-B may include the substrate 812A-B, a lower surface (e.g., as illustrated in FIG. 1) may include the electrode 110 and the magnetic layer 114, an upper surface (e.g., as illustrated in FIG. 1) may include the electrode 110 and the magnetic layer, and separate structure 100 (e.g., an untethered moveable element) situated between the lower and upper surfaces (e.g., as illustrated in FIG. 1). The substrate 812A-B may be composed of silicon, quartz, glass, or a polymer compound.

The lower surface (e.g., as illustrated in FIG. 1) may be realized by forming a lower magnetic layer that may be electrically conductive by depositing a layer of a hard magnetic material (e.g., an AlNiCo, NdFeB, SmCo alloys, another suitable material, etc.). In cases where the substrate is electrically conductive, an insulating layer (e.g., SiO2, Si3N4, another insulator, etc.) may be deposited between a substrate (e.g., the substrate 812A-B of FIG. 8) and the magnetic layer 114 to provide electrical isolation. In an alternate embodiment, the lower surface may include two separate layers, one providing a magnetic moment, and another providing electrical conductivity.

Both layers may be patterned using photomask lithography (e.g., a photomask may be an opaque plate with holes or transparencies that may allow light to shine through in a defined pattern, that may expose some part of the semiconductor) and etching (e.g., the etching may be used in microfabrication to chemically remove layers from the surface of a wafer during manufacturing), laser etching (e.g., a fabrication process that may user laser to remove layers from the surface of the target material), and/or another suitable patterning method, to define the required shape. In an alternate embodiment, the top surface may include landing pads (e.g., contact surfaces) that may be maintained at the same potential as the moveable element (e.g., the separate structure 100).

The separate structure 100 (e.g., an untethered moveable element) may be realized by depositing a soft magnetic material layer (e.g., NiFe, Ni, Fe—Si alloy, etc.) surrounded on top and bottom by a sacrificial material (e.g., photoresist, polyimide, silicon-dioxide etc.). Each of the layers may be patterned as required using photolithographic or other appropriate techniques. The top surface may include a layer of hard magnetic material that may be electrically conductive, or alternately two separate layers—one providing a magnetic moment, and the other providing electrical conductivity, may be deposited on top of the sacrificial layer surrounding the separate structure 100 (e.g., untethered moveable element) and patterned using any appropriate technique. The top surface may optionally provide landing pads that are maintained at the same electrical potential as the separate structure 100 (e.g., moveable element).

Figure 6:
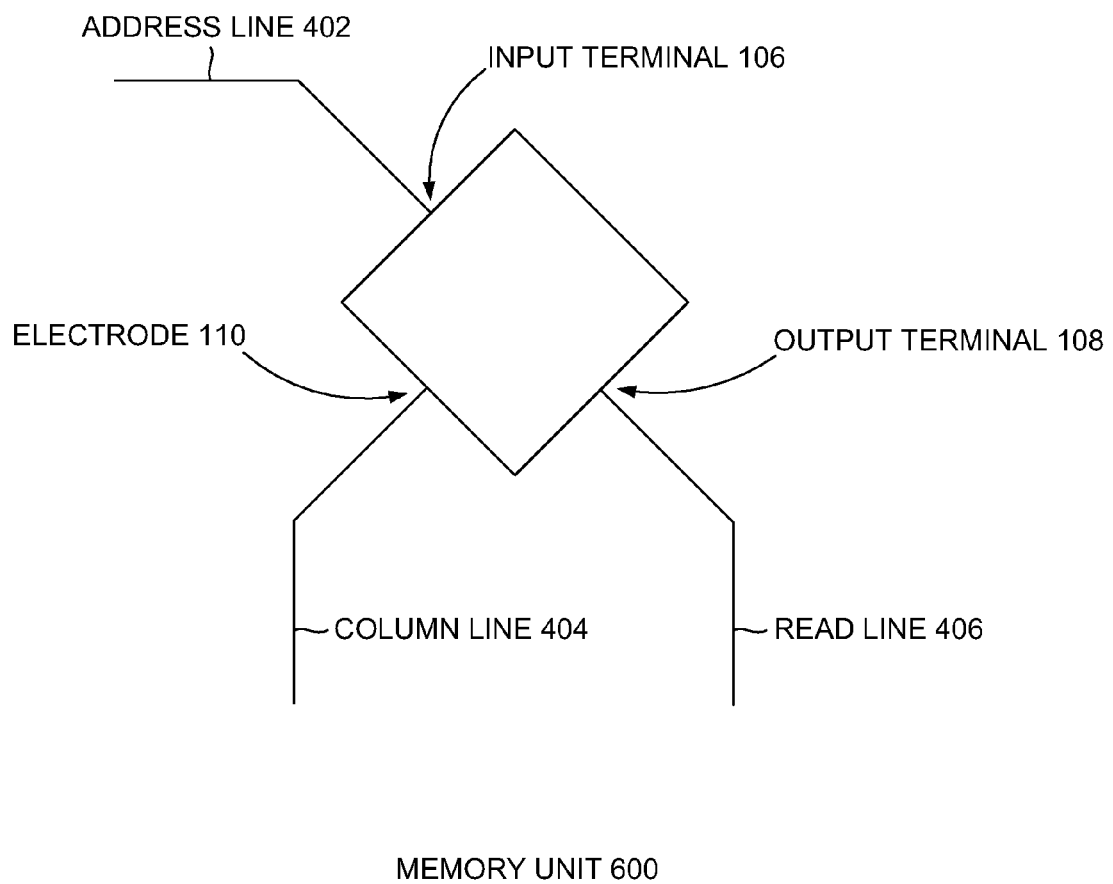
FIG. 6 is a system view of the memory unit, according to one embodiment.

FIG. 6 is a system view of the memory device, according to one embodiment. Particularly, FIG. 6 illustrates the input terminal 106, the output terminal 108, the electrode, the row line 402, the column line 404, and the read line 406, according to one embodiment.

In an example embodiment, FIG. 6 illustrates a memory unit as a system with three terminals (e.g., the input terminal 106, the output terminal 108, and the electrode 110). The row line 402 may be used to identify a particular address line in the memory unit. The column line 404 may be used to designate an exact memory location by activating certain switches (e.g., by configuring $\{W_N, S_N\}$, as illustrated in FIG. 4). The read line 406 connected to the memory unit may enable fetching of information from a memory unit selected using the row line 402 and the column line 404.

Figure 7:
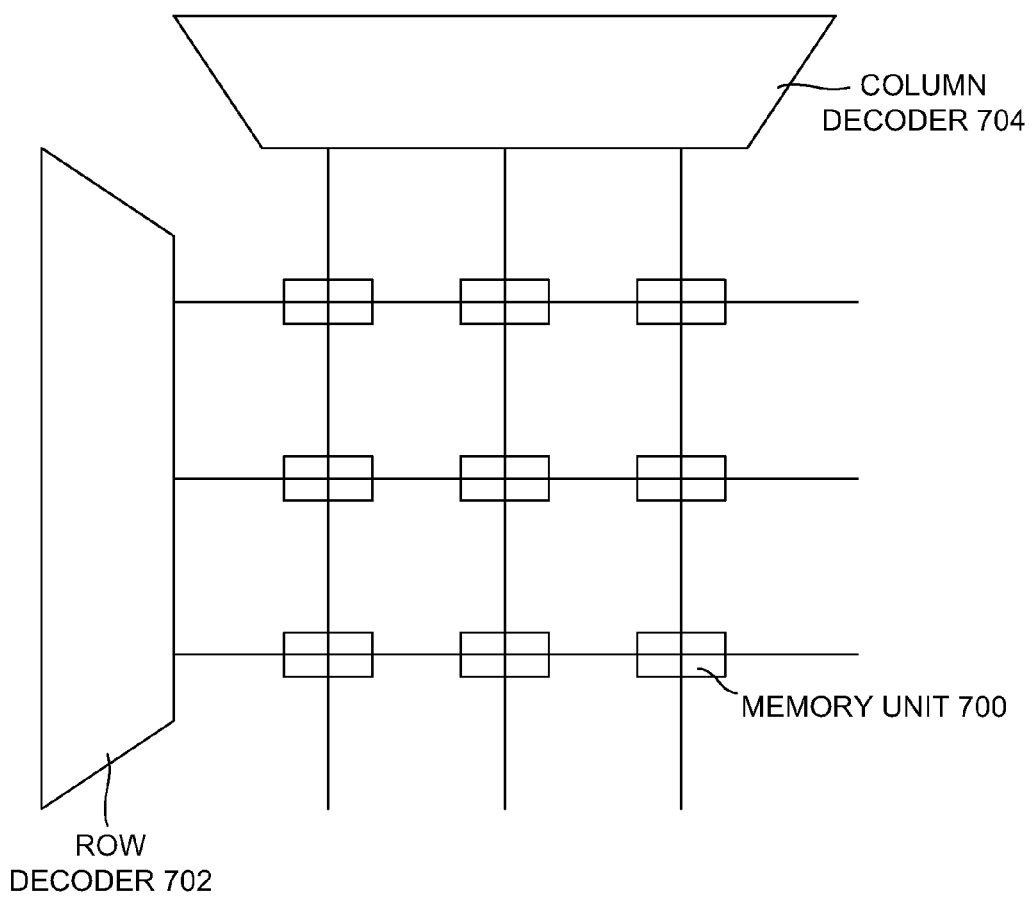
FIG. 7 is a systematic view of memory array, according to one embodiment.

FIG. 7 is a systematic view of memory array, according to one embodiment. Particularly, FIG. 7 illustrates a memory unit 700, a row decoder 702 and a column decoder 704, according to one embodiment.

The memory unit 700 (e.g., an element of a memory array) may be a unit that may be used to store information (e.g., electronic data). The memory unit may have a substrate (e.g., the substrate 812A-B of FIG. 8) made up of a crystalline, poly-crystalline, amorphous substrate, etc.

The row decoder 702 may control which access lines are selected in a particular read and/or write operation. The column decoder 704 may control which column lines are selected in a particular read and/or write operation.

In an example embodiment, FIG. 7 illustrates a group of memory units connected by address lines to a row decoder 702 and connected by column lines to a column decoder 704.

Figure 8:
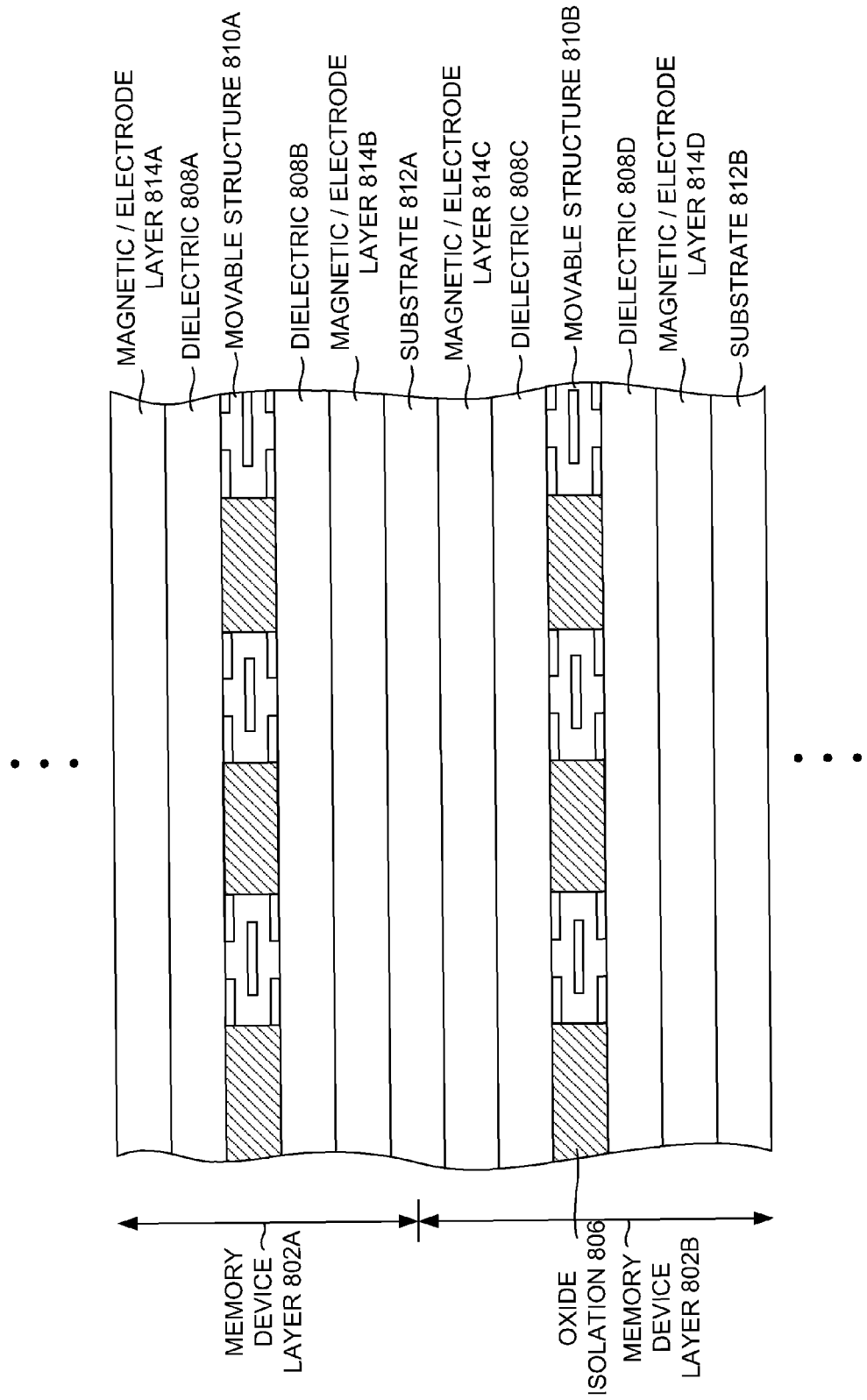
FIG. 8 is a schematic view illustrating a cross-section of a stacked array of memory units, according to one embodiment.

FIG. 8 is a schematic view illustrating structure of the memory unit, according to one embodiment. Particularly, FIG. 8 illustrates a memory device layer 802A-B, an oxide isolation 806, a dielectric 808A-D, a movable structure 810A-B, a substrate 812A-B, and a magnetic/electrode layer 814A-D, according to one embodiment.

The memory device layer 802A-B may be stacked memory arrays that may process (e.g., hold, store, etc.) the information (e.g., data etc.). The oxide isolation 806 may be an oxide layer that may isolate structures (e.g., a movable structure 810A-N) sufficiently in accordance with a requirement of the design of the structure. The dielectric 808A-D may be a substance that may be a poor conductor of electricity, but an efficient supporter of electrostatic fields (e.g., a substance with electrical conductivity of less than a millionth (10) of a Siemens). The movable structure 810A-N may be the separate structure 100 (e.g., a bar, a disk, a cylinder, a pole, a cube, an asymmetrical form, a planar surface, etc). The moveable structure 810A-N may be a material (e.g., a diamagnetic material, a paramagnetic material, a magnetic material, a ferromagnetic material, a permanent magnet, etc.) that may be influenced by a magnetic field. The moveable structure 810A-N may have holes, openings, cutouts, additional surfaces, guide rails, connecting parts for the surface, the other surface and/or the other surrounding surfaces that may be required for storing the data (e.g., information, etc.) in the memory device.

The substrate 812A-B may be a material on which a MEMS circuit is fabricated. The substrate 812A-B may be used for mechanical support and/or insulating purposes (e.g., as with ceramic, plastic, and glass substrates, semiconductor and/or ferrite substrates). The substrate 812A-B may include semiconductor and/or ferrite substrates that may provide useful electrical functions. The magnetic/electrode layer 814A-D may be a combination of the magnetic layer 114 and the electrode layer (e.g., includes the electrode 110 and/or additional electrode 112).

In an example embodiment, FIG. 8 illustrates a structural view of memory devices (e.g., the memory device layer 802A-B). The structure of the memory unit (e.g., the memory unit 600, the memory unit 700, etc.) may include the magnetic/electrode layer 814A-D, dielectric 808A-D, the movable structure 810A-B (e.g., the memory unit 600, the memory unit 700) and the substrate 812A-B.

In one embodiment, the substrate layer may be created below the magnetic layer 114. The substrate layer may include a polymer, a glass, a metallurgical grade silicon, an impure silicon, and/or a standard silicon. The magnetic layer 114 may be formed above the substrate layer. The electrode 110 may be created above the magnetic layer. The separate structure 100 may be placed above the electrode 110. The additional electrode 112 may be formed above the separate structure 100. An other magnetic layer may be placed above the additional electrode 112.

Figure 9A:
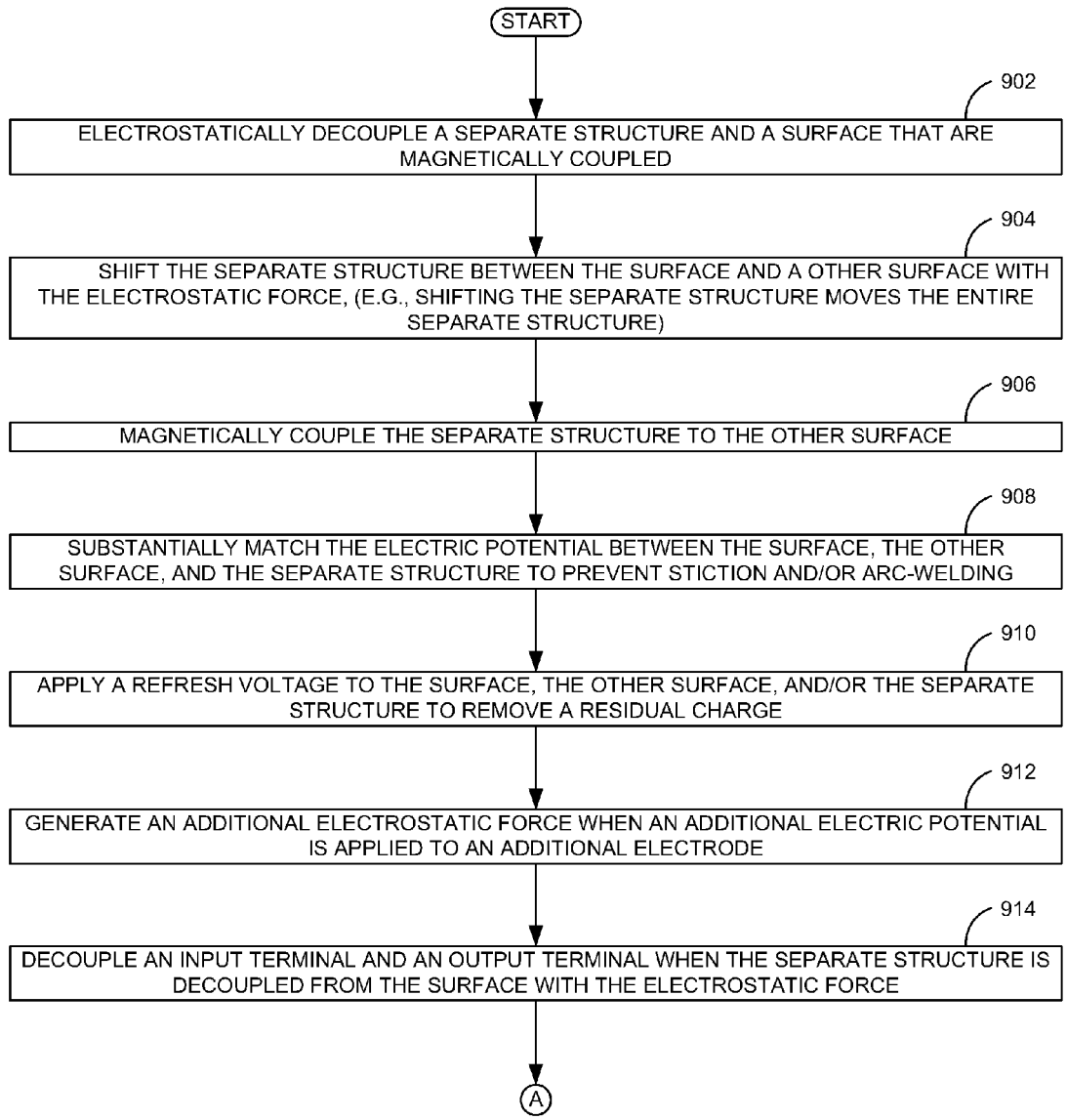
FIG. 9A is a process flow for decoupling a separate structure from a surface and coupling the separate structure to other surface and performing the read/write operation to the memory unit, according to one embodiment.

FIG. 9A is a process flow for decoupling a separate structure from a surface and coupling the separate structure to other surface and performing the read/write operation to the memory unit (e.g., the memory unit 600, the memory unit 700), according to one embodiment. In operation 902, a separate structure (e.g., the separate structure 100 of FIG. 1) and a surface (e.g., the surface 102 of FIG. 2) that are magnetically coupled may be electrostatically decoupled (e.g., an electrostatic force to decouple the separate structure 100 and the surface 102 may be generated with the electrode 110).

In operation 904, the separate structure 100 may be shifted between the surface 102 and an other surface (e.g., the other surface 104 of FIG. 1) with the electrostatic force (e.g., shifting the separate structure 100 may move the entire separate structure 100). In operation 906, the separate structure 100 may be magnetically coupled to the other surface 104. The separate structure 100 may be magnetically coupled when a magnetic attraction holds the separate structure 100 in proximity to the surface 102 and/or the other surface 104.

The electrode 110 may generate an electrostatic force when an electric potential is applied to the electrode 110. The surface 102, the other surface 104, and the separate structure 100 may each include a nonmagnetic material, a paramagnetic material, a diamagnetic material, a magnetic material and/or a ferromagnetic material. In operation 908, the electric potential may be substantially matched between the contact surface 116, the surface 102, the other surface 104, and the separate structure 100 to prevent stiction and arc-welding. In operation 910, a refresh voltage may be applied to the surface 102, the other surface 104, and/or the separate structure 100 to remove a residual charge.

In one embodiment, the contact surface 116 and the surface are comprised of the same surface. In another embodiment, the contact surface 116 and the surface are separate surfaces that may have different electrical potentials.

In operation 912, an additional electrostatic force may be generated when an additional electric potential is applied to an additional electrode (e.g., the additional electrode 112 of FIG. 1). In operation 914, an input terminal (e.g., the input terminal 106 of FIG. 1) and an output terminal (e.g., the output terminal 108 of FIG. 1) may be decoupled when the separate structure 100 is decoupled from the surface 102 with the electrostatic force. The input terminal 106 and the output terminal 108 may be electrically coupled when the separate structure 100 is magnetically coupled to the surface 102. The electrostatic force may be generated with the electrode 110 and the additional electrode 112.

Figure 9B:
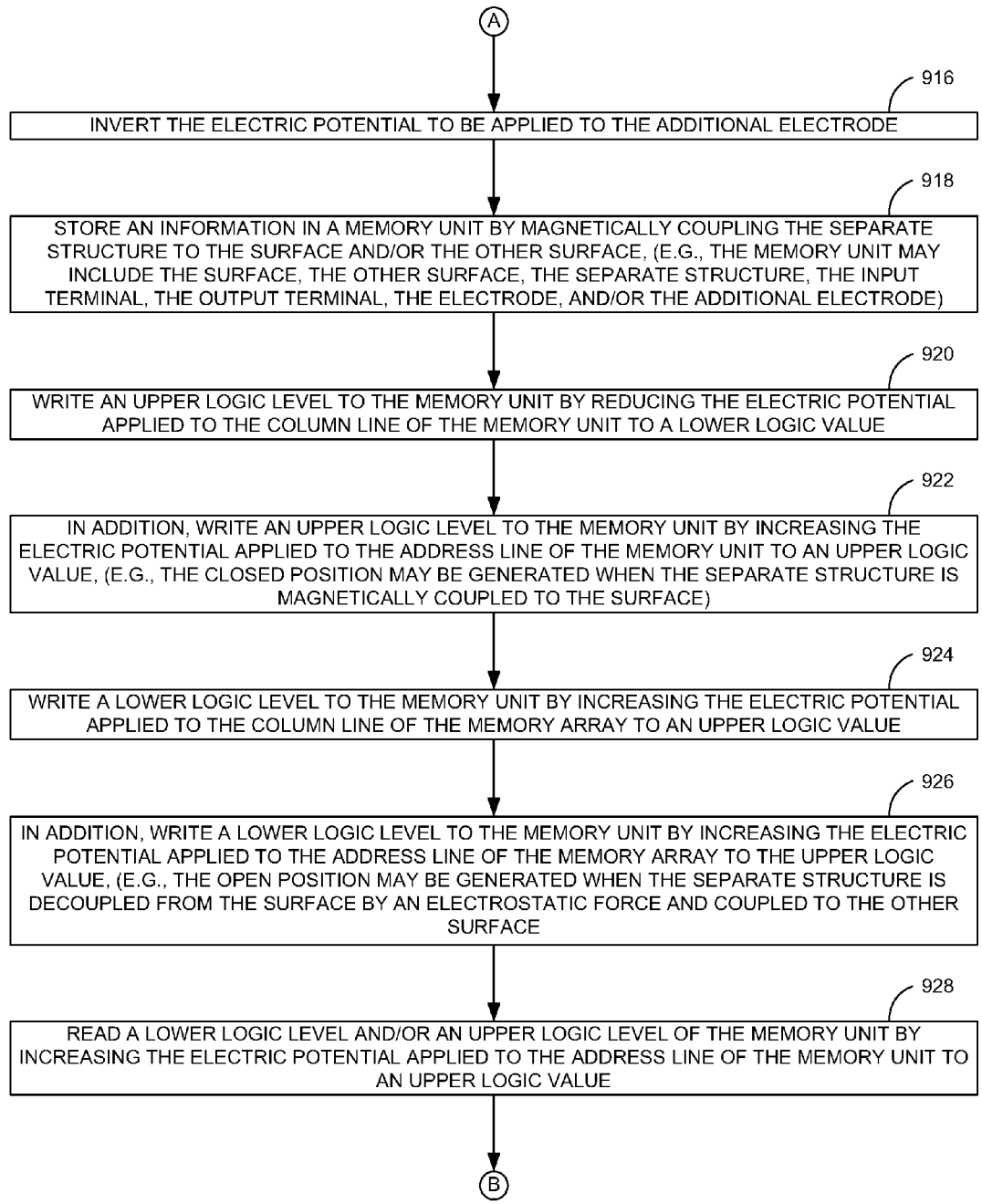
FIG. 9B is a continuation of process flow of FIG. 9A, illustrating additional operations, according to one embodiment.

FIG. 9B is a continuation of process flow of FIG. 9A, illustrating additional operations, according to one embodiment. In operation 916, the electric potential to be applied to the additional electrode 112 may be inverted (e.g., may have an opposite polarity potential). In operation 918, information in a memory unit (e.g., the memory unit 600, the memory unit 700) may be stored by magnetically coupling the separate structure 100 to the surface 102 and/or the other surface 104. The memory unit may include the surface 102, the other surface 104, the separate structure 100, the input terminal, the output terminal 108, the electrode 110, and/or the additional electrode 112.

The memory unit (e.g., the memory unit 600, the memory unit 700) may be an element of a memory array (e.g., the array of memory units 400). The input terminal 106 may be coupled to an address line, the output terminal 108 may be coupled to a read line (e.g., the read line 406 of FIG. 4), and/or the electrode 110 may be coupled to a column line (e.g., the column line 404 of FIG. 4). In operation 920, an upper logic value may be written to the memory unit by reducing the electric potential applied to the column line 404 of the memory unit to a lower logic value. In operation 922, the upper logic value may be written to the memory unit by increasing the electric potential applied to the address line of the memory unit to an upper logic value. The upper logic value may be generated when the separate structure 100 is magnetically coupled to the surface 102.

In operation 924, a lower logic value may be written to the memory unit (e.g., the memory unit 600, the memory unit 700) by increasing the electric potential applied to the column line 404 of the memory array to an upper logic value. In operation 926, the lower logic value may be written to the memory unit by increasing the electric potential applied to the address line of the memory array to the upper logic value. The lower logic value may be generated when the separate structure 100 is decoupled from the surface 102 by an electrostatic force and coupled to the other surface 104. In operation 928, a lower logic value and an upper logic value of the memory unit may be read by, increasing the electric potential applied to the address line of the memory unit to an upper logic value.

Figure 9C:
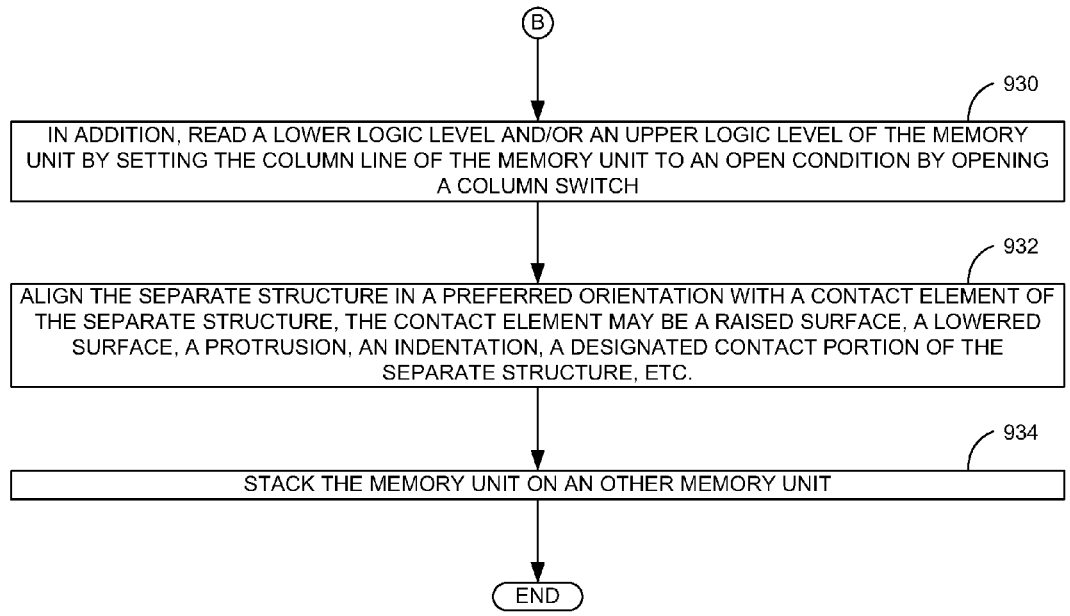
FIG. 9C is a continuation of process flow of FIG. 9B, illustrating additional operations, according to one embodiment.

FIG. 9C is a continuation of process flow of FIG. 9B, illustrating additional operations, according to one embodiment. In operation 930, a lower logic value and an upper logic value of the memory unit (e.g., the memory unit 600, the memory unit 700) may be read by setting the column line 404 of the memory unit to an open condition by opening a column switch. A column switch output may be coupled to the column line 404 (e.g., column input and a column output may be decoupled when the column switch is opened). In operation 932, the separate structure 100 may be aligned in a preferred orientation with a contact element of the separate structure 100 (e.g., the contact element may be a raised surface, a lowered surface, a protrusion, an indentation, and/or a designated contact portion of the separate structure 100). In operation 934, the memory unit may be stacked on an other memory unit. The separate structure 100 may include a bar, a disk, a cylinder, a pole, a cube, an asymmetrical form, and/or a planar surface.

Figure 10:
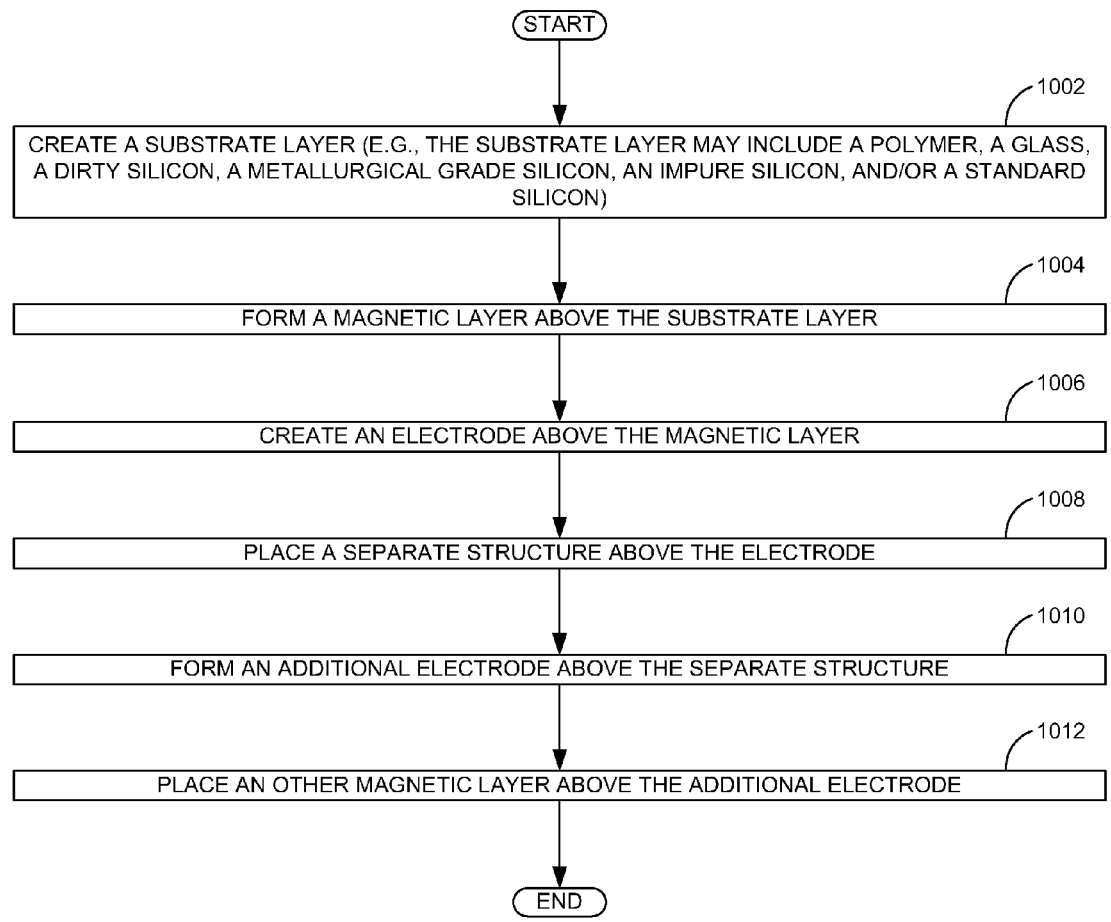
FIG. 10 is a process flow illustrating the fabrication of the memory unit, according to one embodiment.

FIG. 10 is a process flow illustrating the fabrication of the memory unit (e.g., the memory unit 600, the memory unit 700), according to one embodiment. In operation 1002, a substrate layer may be created. The substrate layer may include a polymer, a glass, a ceramic, a metallurgical grade silicon, an impure silicon, and/or a standard silicon. In operation 1004 a magnetic layer (e.g., the magnetic/electrode layer 814A-D of FIG. 8) may be formed above the substrate layer. In operation 1006, an electrode (e.g., the electrode 110 of FIG. 1) may be created above the magnetic layer 114. In operation 1008, a separate structure (e.g., the separate structure 100) may be placed above the electrode 110. In operation 1010, an additional electrode (e.g., the additional electrode 112 of FIG. 1) may be formed above the separate structure 100. In operation 1012, an other magnetic layer may be placed above the additional electrode 112.

In particular, switches, the 3-terminal storage device, the terminal storage device, the memory unit (e.g., the memory unit 600, the memory unit 700), the electrode, and/or the dielectric may be enabled using software and/or using transistors, logic gates, and electrical circuits (e.g., application specific integrated ASIC circuitry), and other circuits.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method, comprising:
    electrostatically decoupling a separate structure and a surface that are magnetically coupled, wherein an electrostatic force to decouple the separate structure and the surface is generated with an electrode;
    shifting the separate structure between the surface and an other surface with the electrostatic force, wherein shifting the separate structure moves the entire separate structure and the electrode generates the electrostatic force when an electric potential is applied to the electrode;
    magnetically coupling the separate structure to the other surface;
    decoupling an input terminal and an output terminal when the separate structure is decoupled from the surface with the electrostatic force, wherein the input terminal and the output terminal are electrically coupleable when the separate structure is magnetically coupled to the surface;
    storing an information in a memory unit by magnetically coupling the separate structure to at least one of the surface and the other surface, wherein the memory unit is comprised of the surface, the separate structure, the input terminal, and the output terminal; and
    reading at least one of a lower logic value and an upper logic value of the memory unit by:
        increasing an electric potential applied to an address line of the memory unit to the upper logic value, and
        setting a column line of the memory unit to an open condition by opening a column switch, wherein a column switch output is coupled to the column line, and wherein a column input and a column output are decoupled when the column switch is opened,
    wherein the separate structure is magnetically coupled when a magnetic attraction holds the separate structure in proximity to at least one of the surface and the other surface,
    wherein the surface, the other surface, and the separate structure are each comprised of at least one of a magnetic material and a ferromagnetic material,
    wherein an additional electrode is used to generate the electrostatic force,
    wherein the memory unit is an element of a memory array, wherein the input terminal is coupled to the address line, the output terminal is coupled to a read line, and the electrode is coupled to the column line.

2. The method of claim 1 further comprising applying a refresh voltage to at least one of the surface, the other surface, the contact surface, and the separate structure to remove a residual charge.

3. The method of claim 1, further comprising applying a different electric potential to the additional electrode to shift the separate structure.

4. The method of claim 1, further comprising writing an upper logic value to the memory unit by:
    reducing an electric potential applied to the column line of the memory unit to a lower logic value; and
    increasing an electric potential applied to the address line of the memory unit to the upper logic value, wherein the upper logic value of the memory unit is generated when the separate structure is magnetically coupled to the surface.

5. The method of claim 1, further comprising writing a lower logic value to the memory unit by:
    increasing an electric potential applied to the column line of the memory array to an upper logic value; and
    increasing an electric potential applied to the address line of the memory array to the upper logic value, wherein the lower logic value of the memory unit is generated when the separate structure is decoupled from the surface by the electrostatic force and coupled to the other surface.

6. The method of claim 1 further comprising aligning the separate structure in a preferred orientation with a contact element of the separate structure, wherein the contact element is at least one of a raised surface, a lowered surface, a protrusion, an indentation, and a designated contact portion of the separate structure.

7. The method of claim 1 further comprising stacking the memory unit on an other memory unit.

8. The method of claim 1 wherein the separate structure is comprised of at least one of a bar, a disk, a cylinder, a pole, a cube, an asymmetrical form, and a planar surface.

* * * * *